United States Patent
Gao et al.

(10) Patent No.: US 8,817,426 B2
(45) Date of Patent: Aug. 26, 2014

(54) MAGNETIC SENSOR HAVING COFEBTA IN PINNED AND FREE LAYER STRUCTURES

(75) Inventors: Zheng Gao, San Jose, CA (US); Yingfan Xu, San Jose, CA (US); Hua Ai Zeng, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 150 days.

(21) Appl. No.: 13/275,208

(22) Filed: Oct. 17, 2011

(65) Prior Publication Data

US 2013/0094108 A1    Apr. 18, 2013

(51) Int. Cl.
*G11B 5/39*    (2006.01)

(52) U.S. Cl.
USPC .................. 360/324.11; 360/324.12

(58) Field of Classification Search
CPC ...................................... G11B 5/3909
USPC .................................. 360/313–328
See application file for complete search history.

(56) References Cited

U.S. PATENT DOCUMENTS

| | | | |
|---|---|---|---|
| 7,079,361 B2 | 7/2006 | Sugita et al. | |
| 7,098,495 B2 | 8/2006 | Sun et al. | |
| 7,602,033 B2 | 10/2009 | Zhao et al. | |
| 7,855,860 B2 | 12/2010 | Ishiwata | |
| 7,978,439 B2 | 7/2011 | Zhang et al. | |
| 2009/0121710 A1 | 5/2009 | Wang et al. | |
| 2009/0155629 A1 | 6/2009 | Gill | |
| 2009/0213503 A1* | 8/2009 | Sun et al. | 360/324.2 |
| 2010/0073827 A1 | 3/2010 | Zhao et al. | |
| 2010/0128400 A1 | 5/2010 | Lin | |
| 2010/0173174 A1 | 7/2010 | Imakita | |
| 2010/0177449 A1 | 7/2010 | Zhao et al. | |
| 2011/0045320 A1 | 2/2011 | Choi et al. | |
| 2011/0134563 A1 | 6/2011 | Komagaki et al. | |
| 2012/0012952 A1* | 1/2012 | Chen et al. | 257/421 |

* cited by examiner

*Primary Examiner* — Craig A. Renner
(74) *Attorney, Agent, or Firm* — Zilka-Kotab, PC

(57) ABSTRACT

A magnetic read sensor having improved magnetic performance and robustness. The magnetic sensor includes a magnetic free layer and a magnetic pinned layer structure. The magnetic pinned layer structure includes first and second magnetic layers separated from one another by a non-magnetic coupling layer. The second magnetic layer of the magnetic pinned layer structure includes a layer of CoFeBTa, which prevents the diffusion of atoms and also promotes a desired BCC crystalline grain growth. The magnetic free layer structure can also include such a CoFeBTa layer for further prevention of atomic diffusion and further promotion of a desired BCC grain growth.

16 Claims, 5 Drawing Sheets

MAGNETIC SENSOR HAVING COFEBTA IN PINNED AND FREE LAYER STRUCTURES

FIELD OF THE INVENTION

The present invention relates to magnetic data recording and more particularly to a magnetic read head having a layer of CoFeBTa within one or both of the free layer and pinned layer structures. The addition of CoFeBTa in these layers improves sensor performance by preventing diffusion within the sensor layers and by promoting a BCC grain structure in layer of the sensor.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Tunnel Junction Magnetoresisive (TMR) sensor can be employed to read a magnetic signal from the magnetic media. The sensor includes a non-magnetic, electrically insulating barrier layer (if the sensor is a TMR sensor) sandwiched between first and second ferromagnetic layers, hereinafter referred to as a pinned layer and a free layer. Magnetic shields are positioned above and below the sensor stack and can also serve as first and second electrical leads so that the electrical current travels perpendicularly to the plane of the free layer, tunnel barrier layer and pinned layer (current perpendicular to the plane (CPP) mode of operation). The magnetization direction of the pinned layer is pinned perpendicular to the air bearing surface (ABS) and the magnetization direction of the free layer is located parallel to the ABS, but free to rotate in response to external magnetic fields. The magnetization of the pinned layer is typically pinned by exchange coupling with an antiferromagnetic layer.

The electrical resistance through the barrier layer (insulator material) of a magnetic tunneling junction changes with the relative orientation of the free layer magnetization with respect to the pinned layer magnetization. When the magnetizations of the pinned and free layer are parallel with one another, a lower resistance is detected and when the magnetizations of the pinned and free layer are antiparallel a higher resistance is detected. In a read mode the resistance of the TMR sensor changes about linearly with the magnitudes of the magnetic fields from the rotating disk. When a sense current is conducted through the TMR sensor, resistance changes cause potential changes that are detected and processed as playback signals. In the case where the barrier layer is comprises MgO, if the MgO has a crystalline (100) texture, adjacent to the pinned layer and the free layer has a BCC crystal structure with (100) texture, implying coherent tunneling and high TMR ratio, the TMR ratio is maximized.

With the push for ever increased data density, it become necessary to constantly improve sensor performance and robustness. Therefore, there remains a need for an improved sensor that having improved pinning strength, improved free layer stability and improved sensitivity.

SUMMARY OF THE INVENTION

The present invention provides a magnetic read sensor that includes a magnetic pinned layer structure including first and second magnetic layer structures and a non-magnetic coupling layer sandwiched between the first and second magnetic layers, a magnetic free layer structure, and a tunnel barrier layer sandwiched between the magnetic free layer structure and the magnetic pinned layer structure. The second magnetic layer of the pinned layer structure includes a layer of CoFeBTa.

In addition, the magnetic free layer structure can include a layer of CoFeBTa. The second magnetic layer of the magnetic pinned layer structure can include first, second, third, and fourth sub-layers, wherein the first sub-layer is constructed of Co, the second sub-layer is constructed of CoFeBTa, the third sub-layer is constructed of CoFeB and the fourth sub-layer is constructed of CoFe.

Similarly, the magnetic free layer structure can be constructed of first, second, third and fourth sub-layers, wherein the first sub-layer is constructed of CoFe, the second sub-layer is constructed of CoFeB, the third sub-layer is constructed of CoFeBTa and the fourth sub-layer is constructed of NiFe. The NiFe is used to balance the magnetostriction of the free layer.

The presence of the CoFeBTa layer in the pinned layer (the second sub-layer of the second magnetic layer) advantageously interrupts the crystal texture growth of the first magnetic layer, nonmagnetic coupling layer and first sub-layer of the second magnetic layer. The CoFeBTa layer also promotes nucleation and growth of the desired BCC crystalline structure with (100) texture in the CoFeB layer and the CoFe layer adjacent to the MgO barrier layer. In addition, it may prevent the diffusion of atoms, such as Mn from the AFM layer into the CoFeB layer, CoFe layer and MgO barrier. This improves the performance of the MgO based TMR sensor by increasing the pinning strength of the pinned layer and also increasing the TMR ratio.

The presence of the CoFeBTa layer in the third sub-layer of the free layer advantageously prevents the diffusion of Ni atoms from the fourth sub-layer NiFe into the first and second sub-layers and MgO barrier, and maintains the BCC structure grown on first and second sub-layers, thereby further improving the sensor's performance by increasing the TMR ratio.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
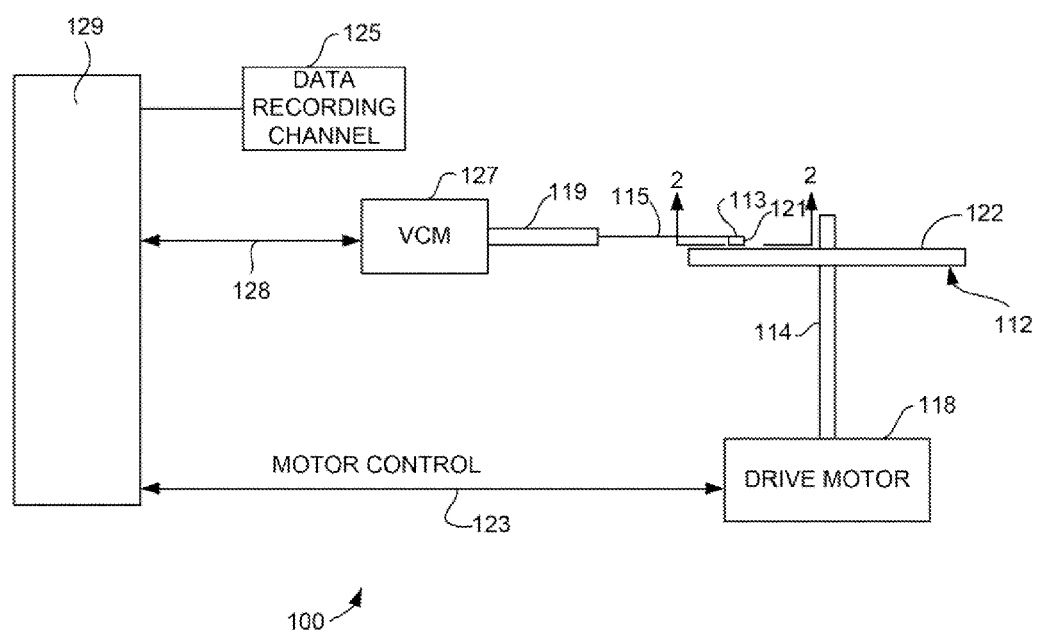
FIG. 1 is a schematic illustration of a disk drive system in which the invention might be embodied.

Referring now to FIG. 1, there is shown a disk drive 100 embodying this invention. As shown in FIG.1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
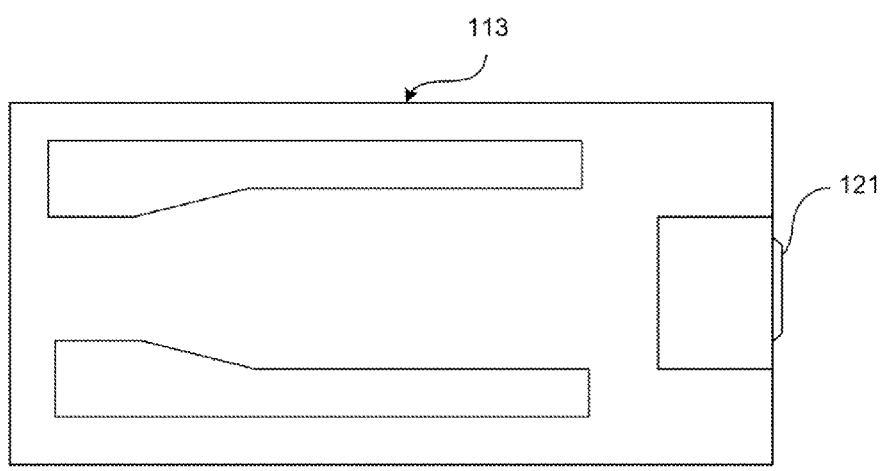
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
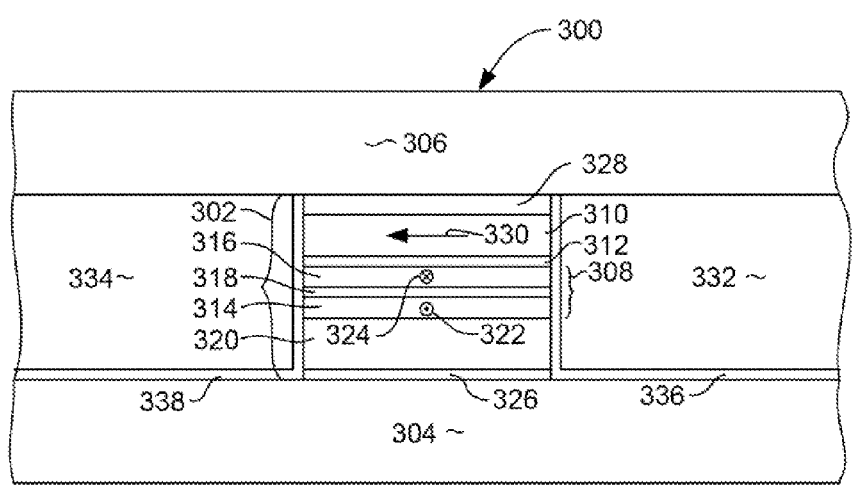
FIG. 3 is an ABS view of a magnetoresistive sensor according to an embodiment of the invention.

FIG. 3 shows a magnetic read head 300 having a sensor stack 302 that is sandwiched between first and second magnetic shields 304, 306. The magnetic shields 304, 306 can be constructed of an electrically conductive, magnetic material such as NiFe so that they can function as electrical leads for supplying a sense current to the sensor stack 302 as well as functioning as magnetic shields. The sensor stack can include a magnetic pinned layer structure 308, a magnetic free layer 310 and a non-magnetic barrier layer 312 sandwiched therebetween. The sensor stack 302 can also include a seed layer 326 at its bottom, which can be provided to ensure a desired grain structure formation in the above deposited layers. The sensor stack 302 can also include a capping layer 328 at its top to protect the under-lying layers from damage during manufacture.

The barrier layer 312 can be constructed as a layer of MgO sandwiched between layers of Mg (e.g. Mg/MgO/Mg). To construct such a barrier layer 312, a thin layer of Mg is first deposited by DC sputtering using a Mg target. A Ti (or Ta) pasting process can be used. A MgO layer is then deposited by radio frequency (rf) sputtering using a MgO target. Another thin layer of Mg can then be deposited by DC sputtering using the Mg target. Finally, an oxygen treatment process can be performed to finish the construction of the barrier layer 312. The finished barrier layer 312 can have a thickness of about 8-10 Angstroms.

The pinned layer structure can include first and second magnetic layers 314, 316 that are anti-parallel coupled across a non-magnetic antiparallel coupling layer 318, which can be constructed of Ru and can have a thickness of about 4-6 Angstroms or about 4.5 Angstroms. The first magnetic layer 314 can be exchange coupled with a layer of antiferromagnetic material (AFM layer) 320, which can be a material such as IrMn having a thickness of about 60 Angstroms. This exchange coupling strongly pins the magnetization of first magnetic layer 314 in a first direction perpendicular to the ABS as indicated by arrowhead symbol 322. Anti-parallel coupling between the magnetic layers 314, 316 pins the magnetization of the second magnetic layer 316 in a second direction that is anti-parallel with the first direction and perpendicular to the ABS as indicated by arrow-tail symbol 324.

The AFM layer 320 can be IrMn sputter deposited at a temperature of 200-400 degrees C. using a Kr gas and a gas flow rate of 30-250 sccm. This results in a IrMn AFM layer having an $L1_2$ phase. This $L1_2$ phase greatly increases the interfacial exchange coupling energy between the AFM layer 320 and the AP1 magnetic layer 314. This, therefore, greatly increases the pinning strength. In addition, this also increases the blocking temperature of the AFM layer 320, which improves the thermal robustness of the pinning.

The free layer 310 has a magnetization that is biased in a direction that is generally parallel with the ABS as indicated by arrow 330. Although the magnetization 330 is biased in this direction, it is free to move in response to an external magnetic field, such as from a magnetic medium.

The biasing of the magnetization 330 is achieved by a magnetic bias field from hard magnetic bias layers 332, 334. These magnetic bias layers 332, 334 are permanent magnets formed of a high coercivity magnetic material such as CoPt, or CoPtCr. The bias layers 332, 334 are separated from the sensor stack 302 and from at least the bottom shield 304 by a thin layer of non-magnetic, electrically insulating layers such as alumina 336, 338.

Figure 4:
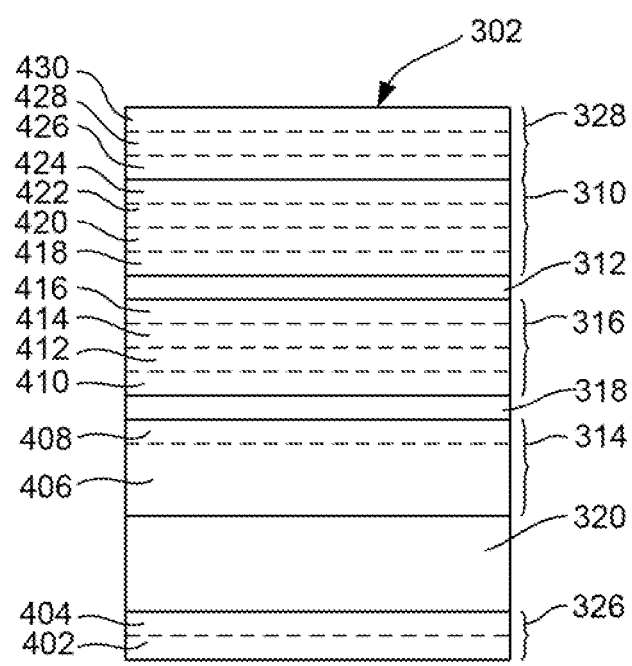
FIG. 4 is an enlarged view of a portion of the sensor of FIG. 3, showing various sub-layers of the sensor.

FIG. 4 shows an enlarged view of the sensor stack 302. With reference to FIG. 4, the material structures of the various layers of a sensor stack 302 according to an embodiment of the invention can be described in greater detail. The seed layer 326 can include a first-sub-layer 402 of Ta or CoHf and a second sub-layer 404 of Ru. The first sub-layer 402 can have a thickness of about 10-20 Angstroms or about 20 Angstroms for Ta, or about 20-40 Angstroms or about 40 Angstroms for CoHf. The second sub-layer 404 can have a thickness of 16-20 Angstroms or about 20 Angstroms.

The first magnetic layer of the pinned layer structure (AP1 314) can include a first sub-layer 406 constructed of CoFe and having a thickness of about 16 Angstroms and a second sub-layer 408 constructed of Co and having a thickness of about 5 Angstroms formed over the first sub-layer 406.

The second magnetic layer of the pinned layer structure (AP2 316) can include a first sub-layer 410 of Co located adjacent to the AP coupling layer 318 and having a thickness of about 5 Angstroms. The AP2 layer 316 also includes a second sub-layer 412 formed over the first sub-layer 410, formed of amorphous CoFeBTa and having a thickness of about 4-6 Angstroms or 5 Angstroms. The AP2 layer 316 further includes a third sub-layer 414 formed over the second sub-layer 412. The third sub-layer 414 can be constructed of CoFeB and can have a thickness of 4-6 Angstroms or about 5 Angstroms. The AP2 layer 316 also includes a fourth sub-layer 416 formed over the third sub-layer 414. The fourth sub-layer 416 is constructed of CoFe and has a thickness of 4-6 Angstroms or about 4.5 Angstroms.

The free layer structure 310 can include first, second, third and fourth sub-layers 418, 420, 422, 424, layer 420 being formed over the layer 418, 422 being formed over 420 and 424 being formed over 422. The first sub-layer 418 can be formed of CoFe having a thickness of 4-6 Angstroms or about 4.8 Angstroms. The second sub-layer 420 can be constructed of CoFeB having a thickness of 8-12 Angstroms or about 10 Angstroms. The third sub-layer 422 can be constructed of amorphous CoFeBTa and can have a thickness of 18-22 Angstroms or about 20 Angstroms. The fourth sub-layer 424 can be constructed of $NiFe_X$ where X is <10, which is used to balance the magnetostriction, and can have a thickness of 30-35 Angstroms or about 32 Angstroms. Alternatively, the $NiFe_X$ can be replace by Ni.

The capping layer structure 328 can be constructed of first, second and third sub-layers 426, 428 and 430, with layer 428 being formed over 426 and 430 being formed over 428. The first sub-layer 426 can be constructed of Ru and can have a thickness of about 15 Angstroms. The second sub-layer 428 can be constructed of Ta and can have a thickness of about 15 Angstroms. The third sub-layer 430 can be constructed of Ru and can have a thickness of about 50 Angstroms.

The presence of the CoFeBTa second sub-layer 412 in the AP2 layer structure 316 advantageously interrupts the crystal texture growth of the first magnetic layer, 314, non-magnetic coupling layer 318 and first sub-layer 410 of the second magnetic layer 316. The CoFeBTa layer 412 also promotes nucleation and growth of the desired BCC crystalline structure with (100) texture in the CoFeB third sub-layer 414 and CoFe fourth sub-layer 416 to the MgO barrier layer 312. In addition, it may prevent the diffusion of atoms such as Mn from the AFM layer 320 into the CoFeB layer 414, CoFe layer 416 and barrier layer 312. This improves the performance of the MgO based TMR sensor 302 by increasing the pinning strength of the pinned layer and the TMR ratio. To best achieve these ends layer 412 preferably has a composition of $(Co_{40}Fe_{40}B_{20})_{(100-x)}Ta_{(x)}$ or $(Co_{60}Fe_{20}B_{20})_{(100-x)}Ta_{(x)}$ where 4<X<10 atomic percent. More generally, the layer 412 can have a composition of $CoFe_xB_yTa_z$ where X is no more than 60 atomic percent, Y is no more than 30 atomic percent and Z is no more than 15 atomic percent. Alternatively, the Ta in the CoFeBTa can be replaced with Hf, Zr, Nb or Mo and the B can be replaced with Al or Si.

The presence of the CoFeBTa layer in the third sub-layer 422 of the free layer structure 310 advantageously prevents the diffusion of Ni atoms from the fourth sub-layer 424 into the first and second sub-layers 418, 420 and barrier 312 and also maintains the BCC structure growth of the first and second sub-layers 418, 420, thereby further improving the sensor's performance by increasing the TMR ratio. The layer 422 preferably has a composition of $(Co_{76}Fe_4B_{20})_{(100-x)}Ta_{(x)}$ where 4<X<10. More generally, the layer 422 can have a composition of $CoFe_xB_yTa_z$ where X is no more than 10 atomic percent, Y is no more than 25 atomic percent, and Z is no more than 10 atomic percent. Alternatively, the Ta in the CoFeBTa can be replaced with Hf, Zr, Nb or Mo and the B can be replaced with Al or Si. The different composition of 422 (as compared with layer 412) ensures a desired magnetization and magnetostriction in the free layer 310.

Figure 5:
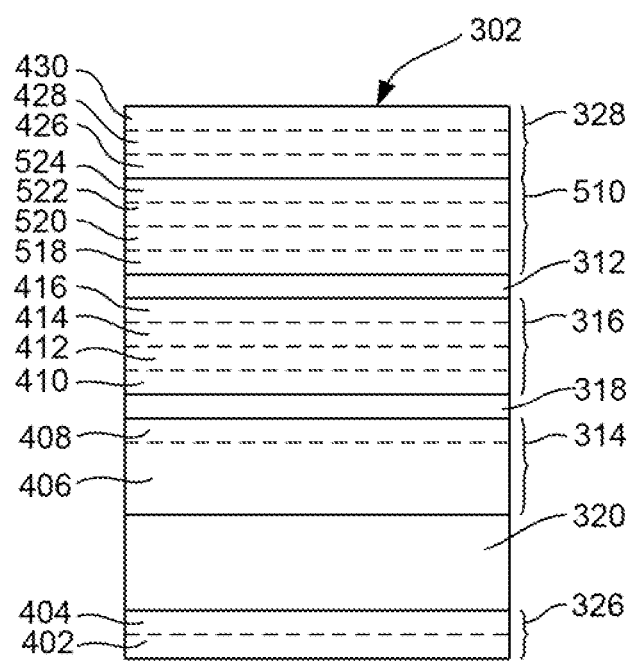
FIG. 5 is a view, similar to that of FIG. 4, illustrating an alternate embodiment of the invention.

FIG. 5 shows an alternate embodiment of the invention. In FIG. 5, the seed layer 326, AFM layer 320, pinned layer structure 314, 318, 316 and capping layer 328 can be the same as that described above with reference to FIGS. 3 and 4. This alternate embodiment, however, has a slightly different free layer structure 510. In this embodiment, the free layer 510 includes a first sub-layer 518 that can be formed of CoFe having a thickness of 4-6 Angstroms or about 4.8 Angstroms. The free layer 510 has a second sub-layer 520 (formed over the first sub-layer 518) that can be constructed of CoFeB having a thickness of 14-18 Angstroms or about 16 Angstroms. The free layer 510 has a third sub-layer 522 (formed over the second sub-layer 520) that can be constructed of amorphous CoHf and can have a thickness of 8-12 Angstroms or about 10 Angstroms. The free layer 510 has a fourth sub-layer 524 (formed over the third sub-layer 522) that can be constructed of $NiFe_{(x)}$ where X<10 and can have a thickness of 32-36 Angstroms or about 34 Angstroms. Alternatively, NiFe can be replaced by pure Ni.

The above described embodiments provide greatly increased pinning strength and greatly improved sensor reliability and robustness. The structure provide increased pinning field, which means that the magnetic head can experience larger extraneous, external magnetic fields without experiencing flipping of the magnetic pinned layer magnetization. In addition, resistance to temperature damage as a result of the higher blocking temperature of the AFM layer 320. What's more, the above described embodiments experience higher TMR ratios as a result of the improved grains structure of the tunnel barrier layer 312 and in the layers directly adjacent thereto.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic read sensor, comprising:
   a magnetic pinned layer structure including a first magnetic layer structure, a second magnetic layer structure and a non-magnetic coupling layer sandwiched between the first and second magnetic layer structures;

a magnetic free layer structure; and a non-magnetic barrier layer sandwiched between the magnetic free layer structure and the magnetic pinned layer structure; wherein the second magnetic layer structure of the pinned layer structure comprises first, second, third and fourth magnetic sub-layers, the first magnetic sub-layer consisting of Co and being located adjacent to the non-magnetic coupling layer, the second magnetic sub-layer comprising CoFeBTa and contacting the first magnetic sub-layer, the third magnetic sub-layer comprising CoFeB and contacting the second magnetic sub-layer and the fourth magnetic sub-layer contacting the third magnetic sub-layer and comprising CoFe.

2. The magnetic sensor as in claim 1 wherein the second magnetic layer structure of the magnetic pinned layer structure is located adjacent to the non-magnetic barrier layer.

3. The magnetic sensor as in claim 1 wherein the free layer comprises first, second, third and fourth free sub-layers, the first free sub-layer being formed over the non-magnetic barrier layer and comprising CoFe, the second free sub-layer being formed over the first free sub-layer and comprising CoFeB, the third free sub-layer being formed over the second free sub-layer and comprising amorphous CoHf and the fourth free sub-layer being formed over the third free sub-layer and comprising $NiFe_X$ where $X<10$.

4. The magnetic sensor as in claim 1 wherein the second sub-layer has a thickness of 4-6 Angstroms.

5. The magnetic sensor as in claim 1 wherein the first sub-layer has a thickness of about 5 Angstroms, the second sub-layer has a thickness of about 5 Angstroms, the third sub-layer has a thickness of about 5 Angstroms and the fourth sub-layer has a thickness of about 4.5 Angstroms.

6. The magnetic sensor as in claim 1 wherein the layer of CoFeBTa has a concentration of $(Co_{40}Fe_{40}B_{20})_{100-X}Ta_X$ where X is 4-10 atomic percent.

7. The magnetic sensor as in claim 1 wherein the layer of CoFeBTa has a concentration of $(Co_{60}Fe_{20}B_{20})_{100-X}Ta_X$ where X is 4-10 atomic percent.

8. The magnetic sensor as in claim 1 wherein the layer of CoFeBTa has a concentration of $CoFe_XB_YTa_Z$, where X is no greater than 60 atomic percent, Y is no greater than 30 atomic percent and Z is not greater than 15 atomic percent.

9. A magnetic sensor as in claim 1 wherein the magnetic free layer structure includes a layer of CoFeBTa.

10. A magnetic sensor as in claim 1 wherein the magnetic free layer structure includes first, second, third and fourth magnetic free sub-layers, the first magnetic free sub-layer being located adjacent to the non-magnetic barrier layer, the second magnetic free sub-layer contacting the first magnetic free sub-layer, the third magnetic free sub-layer contacting the second magnetic free sub-layer and the fourth magnetic free sub-layer contacting the third magnetic free sub-layer, wherein the third magnetic free sub-layer comprises CoFeBTa.

11. A magnetic sensor as in claim 1 wherein the magnetic free layer structure includes first, second, third and fourth magnetic free sub-layers, the first magnetic free sub-layer being located adjacent to the non-magnetic barrier layer, the second magnetic free sub-layer contacting the first magnetic free sub-layer, the third magnetic free sub-layer contacting the second magnetic free sub-layer and the fourth magnetic free sub-layer contacting the third magnetic free sub-layer, wherein the first magnetic free sub-layer comprises CoFe, the second magnetic free sub-layer comprises CoFeB, the third magnetic free sub-layer comprises CoFeBTa and the fourth magnetic free sub-layer comprises NiFe.

12. The magnetic sensor as in claim 9 wherein the layer of CoFeBTa in the magnetic pinned layer structure has a concentration of $(Co_{40}Fe_{40}B_{20})_{100-X}Ta_X$ where $4<X<10$ atomic percent, and the layer of CoFeBTa in the free layer structure has a concentration of $(Co_{76}Fe_4B_{20})_{(100-X)}Ta_{(X)}$ where $4<X<10$ atomic percent.

13. The magnetic sensor as in claim 9 wherein the layer of CoFeBTa in the magnetic pinned layer structure has a concentration of $(Co_{60}Fe_{20}B_{20})_{(100-X)}Ta_{(X)}$ where $4<X<10$ atomic percent, and the layer of CoFeBTa in the free layer structure has a concentration of $(Co_{76}Fe_4B_{20})_{(100-X)}Ta_{(X)}$ where $4<X<10$ atomic percent.

14. The magnetic sensor as in claim 9 wherein the layer of CoFeBTa in the magnetic free layer structure has a concentration of $CoFe_XB_YTa_Z$, where X is no greater than 10 atomic percent, Y is no greater than 25 atomic percent and Z is not greater than 10 atomic percent.

15. A magnetic data recording system, comprising:

a magnetic media;

an actuator;

a slider connected with the actuator for movement adjacent to a surface of the magnetic media; and a magnetic read sensor formed on the slider, the magnetic read sensor further comprising:

a magnetic pinned layer structure including first and second magnetic layer structures and a non-magnetic coupling layer sandwiched between the first and second magnetic layer structures;

a magnetic free layer structure; and a non-magnetic barrier layer sandwiched between the magnetic free layer structure and the magnetic pinned layer structure; wherein the second magnetic layer structure of the pinned layer structure comprises first, second, third and fourth magnetic sub-layers, the first magnetic sub-layer consisting of Co and being located adjacent to the non-magnetic coupling layer, the second magnetic sub-layer comprising CoFeBTa and contacting the first magnetic sub-layer, the third magnetic sub-layer comprising CoFeB and contacting the second magnetic sub-layer and the fourth magnetic sub-layer contacting the third magnetic sub-layer and comprising CoFe.

16. The magnetic data recording system as in claim 15, wherein the magnetic free layer structure includes a layer of CoFeBTa.

* * * * *